United States Patent [19]

Tanaka et al.

[11] Patent Number: 5,028,583
[45] Date of Patent: Jul. 2, 1991

[54] SUPERCONDUCTING THIN FILM AND WIRE AND A PROCESS FOR PRODUCING THE SAME

[75] Inventors: Saburo Tanaka; Hideo Itozaki; Kenjiro Higaki; Shuji Yazu; Tetsuji Jodai, all of Hyogo, Japan

[73] Assignee: Sumitomo Electric Industries, Ltd., Osaka, Japan

[21] Appl. No.: 286,860

[22] Filed: Dec. 20, 1988

[30] Foreign Application Priority Data

| Dec. 20, 1987 | [JP] | Japan | 62-322380 |
| Dec. 22, 1987 | [JP] | Japan | 62-324701 |
| Dec. 22, 1987 | [JP] | Japan | 62-324702 |
| Dec. 22, 1987 | [JP] | Japan | 62-324703 |
| Dec. 22, 1987 | [JP] | Japan | 62-324704 |
| Dec. 22, 1987 | [JP] | Japan | 62-324705 |
| Dec. 22, 1987 | [JP] | Japan | 62-324706 |
| Dec. 22, 1987 | [JP] | Japan | 62-324707 |
| Dec. 22, 1987 | [JP] | Japan | 62-324708 |
| Dec. 22, 1987 | [JP] | Japan | 62-324709 |
| Dec. 22, 1987 | [JP] | Japan | 62-324710 |
| Dec. 29, 1987 | [JP] | Japan | 62-332304 |
| Jan. 22, 1988 | [JP] | Japan | 63-012331 |
| Jan. 22, 1988 | [JP] | Japan | 63-012332 |
| Jan. 22, 1988 | [JP] | Japan | 63-012333 |
| Jan. 22, 1988 | [JP] | Japan | 63-012334 |
| Jan. 22, 1988 | [JP] | Japan | 63-012335 |

[51] Int. Cl.$^5$ ............................................. B32B 9/00
[52] U.S. Cl. ........................................ 505/1; 505/701; 505/702; 505/703; 505/704; 428/209; 428/409; 428/426; 428/432; 428/433; 428/457; 428/688; 428/901; 428/930
[58] Field of Search ........................... 505/1, 701-704; 428/209, 409, 426, 432, 433, 457, 688, 901, 930; 174/68.5

[56] References Cited

PUBLICATIONS

Applied Physics Letters, 51(11) pp. 861-3—Epitaxial Ordering of oxide SC Thin Films on (100) SrTiO$_3$ prepared by pulsed laser evaporation Wu et al. (7-87), Rutgers University.

Thin Film Synthesis of the High-T$_c$ Oxide Superconductor YBa$_2$Cu$_3$O$_7$ by Electron Beam Codepostion, Naito et al.; Dept. of App. Phys., Stanford Univ.

Primary Examiner—Patrick J. Ryan
Attorney, Agent, or Firm—Kerkam, Stowell, Kondracki & Clarke

[57] ABSTRACT

Improvement in a superconducting thin film of compound oxide represented by the formula: LnBa$_2$Cu$_3$O$_{7-\delta}$ (Ln is lanthanide) or (La$_{1-x}\alpha_x$)$_2$CuO$_4$ ($\alpha$ is Ba or Sr) deposited on a substrate or core made of MgO, SrTiO$_3$ or ZrO$_2$ by physical vapor deposition technique, the surface roughness R$_{max}$ (datum length = 1,000 $\mu$m) of the superconducting thin film being less than 0.2 $\mu$m.

7 Claims, No Drawings

SUPERCONDUCTING THIN FILM AND WIRE AND A PROCESS FOR PRODUCING THE SAME

BACKGROUND OF THE INVENTION

1. Field of the Invention

The present invention relates to a superconducting thin film and a process for producing the same. More particularly, it relates to a superconducting thin film having an improved high current density of superconductivity and a process for producing the same.

The superconducting thin film according to the present invention possesses improved surface flatness as well as a high critical temperature and a high current density and is advantageously applicable in a variety of electronics devices including the integrated circuits.

The present invention also relates to a superconducting wire and a process for producing the same. More particularly, it relates to a superconducting wire having an improved high current density of superconductivity and a process for producing the same.

The superconducting wire according to the present invention is advantageously applicable in the field of electric power transportation and in a variety of wiring materials for electronics devices.

2. Description of the Related Art

The superconductivity is a phenomenon which is explained to be a kind of phase changes of electrons under which the electric resistance become zero and the perfect diamagnetism is observed.

In the field of electronics, a variety of superconducting devices are known. A typical application of the superconducting device is Josephson device in which quantum efficiency is observed macroscopically when an electric current is passed through a weak junction arranged between two superconductors.

The tunnel junction type Josephson device is expected to be a high-speed and low-power consuming switching device owing to smaller energy gap of the superconducting material. It is also expected to utilize the Josephson device as a high sensitive sensor or detector for sensing very weak magnetic field, microwave, radiant ray or the like since variation of electromagnetic wave or magnetic field is reflected in variation of Josephson effect and can be observed as a precise quantum phenomenon. Development of the superconducting devices such as high-speed logic units or no power-loss wiring materials is also demanded in the field of high-speed computers in which the power consumption per unit area is reaching to the upper limit of the cooling capacity with increment of the integration density in order to reduce energy consumption.

The superconducting wire is demanded in the field of electromagnetic coils or a variety of electric parts as well as in the field of electric power transportation. For example, in the high-speed computers, the superconducting wires is demanded as a wiring material for IC packaging or the like for delivering current without any loss of power.

However, the critical temperature "Tc" of superconductivity could not exceed 23.2K of $Nb_3Ge$ which was the highest Tc for the past ten years.

The possibility of an existence of a new type of superconducting material having much higher Tc was revealed by Bednorz and Müller, who discovered a new oxide type superconductor in 1986 [Z. Phys. B64 (1986) 189].

The new type compound oxide superconductor discovered by Bednorz and Müller is represented by $[La, Sr]_2CuO_4$ which is called the $K_2NiF_4$-type oxide having a crystal structure which is similar to known perovskite type oxides. The $K_2NiF_4$-type compound oxides show such higher Tc as 30K which are extremely higher than known superconducting materials.

It was also reported that C. W. Chu et al. discovered, in the United States of America, another superconducting material so called YBCO type represented by $YBa_2Cu_3O_{7-x}$ having the critical temperature of about 90K in February 1987. And hence, the possibility of an existence of high-temperature superconductors have burst onto the scene.

It is said that the superconducting properties of the above-mentioned new type compound oxide superconductors are influenced by the oxygen deficiency in the crystal. In fact, if the oxygen deficiency do not exist in the crystal, Tc can not be higher and a discrepancy between the on-set temperature and a temperature where perfect zero resistance is observed become big.

Generally, the thin films composed of the above-mentioned new type superconducting materials are prepared by physical vapour deposition technique. However, the critical current density "Jc" observed in the superconducting thin film obtained is very low even if the thin film possesses a high critical temperature "Tc". Such low critical current density is a problem when the thin films are utilized as superconductors in practical uses.

The superconducting wires composed of the compound oxides are generally produced by a wire-drawing technique in which sintered powder material of the compound oxide is compacted in a metallic sheath which is then drawn. In the superconducting wires produced by the conventional technique, however, it is difficult to improve the critical current density even if the superconducting wire shows a high critical temperature Tc. In fact, since the compound oxide is an anisotropic crystal in which electric current flow mainly along its c-axis, the maximum current density of the conventional superconducting wire which is produced by the conventional technique in which powders of such compound oxide is compacted at random is limited to a value which is insufficient to use the wire in practical uses.

In the conventional sputtering technique for preparing a thin film composed of the ceramics type oxide superconductors disclosed in Japanese patent laid-open No. 56-10,9824, sputtering is effected in oxygen-containing atmosphere while the substrate is heated in order to improve ordering or orientation of the crystal and the resulting film deposited on the substrate by the sputtering stage is further heat-treated in order to increase the oxygen-content in the thin film.

This patent teaches that the superconducting thin film which is represented by the formula $BaPb_{1-x}Bi_xO_3$ (in which $005 \leq x \leq 0.35$) and which is prepared in an oxygen-containing atmosphere by high-frequency sputtering technique should be further heat-treated at 500° to 550° C. but mentions nothing about the conditions how to prepare the thin film of high-Tc superconductor which was discovered after the filing date of this patent.

The present applicant already proposed several processes for preparing the thin films of the high-Tc superconductor in the following patent applications: U.S. patent application Ser. No. 152,714 filed on Feb. 2, 1988, U.S. patent application Ser. No. 167,895 filed on Mar. 13, 1988, U.S. patent application Ser. No. 195,145 filed on May 18, 1988, U.S. patent application Ser. No. 195,147 filed on May 18, 1988, U.S. patent application Ser. No. 200,206 filed on May 31, 1988 or the like.

Although the processes disclosed in these patent applications are themselves useful and satisfactory, it is still requested to improve further the critical temperature and particularly the critical current density. The present invention is an extension of and an improvement in these patent applications.

Therefore, an object of the present invention is to provide an improved thin film which is composed of compound oxide type superconducting material and which has a high critical density of superconductivity in addition to the high critical temperature and a process for producing the same.

Another object of the present invention is to solve the above-mentioned problem and to provide an improved compound oxide type superconducting wire having higher current density.

SUMMARY OF THE INVENTION

The first subject matter of the present invention is a superconducting composite consisting of a substrate and a superconducting thin film which is deposited on the substrate and which is composed mainly of compound oxide, characterized in that the substantial portion of a surface of the superconducting thin film is smooth.

The second subject matter of the present invention is a superconducting wire consisting of a core and a superconducting thin film which is deposited on the core and which is composed mainly of compound oxide, characterized in that the substantial portion of a surface of the superconducting thin film is smooth.

The expression of "the substantial portion " mean that the majority, for example more than 80% of the surface of the superconducting thin film is smooth even if voids or defects which are inevitably produced when a thin film is deposited on a large area by the physical vapour deposition technique are observed in the remaining minor portion of the surface.

The smoothness of the superconducting thin film is evaluated by such a fact that the surface roughness $R_{max}$ (datum length = 1,000 $\mu$m) of the superconducting thin film composed mainly of compound oxide is less than 0.2 $\mu$m. The value of the surface roughness $R_{max}$ is determined by observing the thin film obtained microscopically, particularly by SEM.

Experiments which were conducted by the present inventors revealed such a fact that the critical current density "Jc" observed on the thin film obtained decrease sharply if the surface roughness $R_{max}$ is not less than 0.2 $\mu$m.

The superconducting thin film according to the present invention is composed mainly of compound oxide represented by the following general formula (1) and (2):

(1)

in which "Ln" stands for at least one lanthanide element selected from a group comprising La, Nd, Sm, Eu, Gd, Dy, Ho, Y, Er, Yb, Tm and $\delta$ is a number which satisfies a range of $0 \leq \delta < 1$.

The "Ln" is preferably Y, Er, Ho or Dy. The compound oxide is considered to be consisted mainly of perovskite type or quasi-perovskite type oxide.

An atomic ratio of the lanthanide element "Ln":Ba:Cu is preferably 1:2:3 as is defined by the formula but the atomic ratio is not restricted strictly to this ratio. In fact, the other compositions whose atomic ratio deviate from the above-mentioned value by 50%, more preferably by 20% can be included in the scope of the present invention. The expression of "composed mainly of" defined in claims means that compound oxides whose atomic ratio of Ln:Ba:Cu is not equal to 1:2:3 are also included in the scope of the present invention.

This definition means also that the compound oxide can contain impurities which exist inevitably at the concentration of ppm order as well as another component which is added intentionally in order to improve the other properties of the thin film obtained.

As the components added intentionally, it can be mentioned Sr, Ca, Mg or Be of the IIa group of the periodic table and an element which is selected from elements of IIIa, Ib, IIb, IIIb, IVa and VIIa groups of the periodic table such as Ti, V but which is not the elements contained in the formula.

(2)

in which $\alpha$ stands for Ba or Sr and $0 < x < 1$.

The compound oxide is considered to be consisted mainly of perovskite type or quasi-perovskite type oxide. It is preferable that an atomic ratio of La:Ba (or Sr):Cu satisfies the value defined by the formula but the atomic ratio is not restricted strictly to the ratio. In fact, it is often observed that the other compositions whose atomic ratio deviate from the above-mentioned ratio by 50%, more preferably by 20% also show effective superconducting property. Therefore, the expression of "composed mainly of" defined in claims means that compound oxides whose atomic ratio are not equal to the value defined by the formula are also included in the scope of the present invention.

This definition means also that the compound oxide can contain. impurities which exist inevitably at the concentration of ppm order as well as another component which is added intentionally in order to improve the other properties of the thin film obtained.

As the components which can be added intentionally, it may be mentioned Sr, Ca, Mg or Be of IIa group of the periodic table and an element selected from elements of IIIa, Ib, IIb, IIIb, IVa and VIIIa groups of the periodic table such as Ti, V which are not the elements contained in the formula.

In the case of the superconducting thin film which is the first subject matter of the present invention, the substrate on which the superconducting thin film of compound oxide is deposited can be a substrate made of perovskite type crystal or oxide, or a substrate made of metal or semiconductor on which a buffer layer composed of perovskite type crystal or oxide is deposited. The substrate is preferably made of single crystal of MgO, SrTiO$_3$, ZrO$_2$, YSZ or Al$_2$O$_3$, polycrystal of Al$_2$O$_3$ or made of metal or semiconductor having a buffer layer made of these materials and having a deposition surface on which the superconducting thin film is deposited. The thin film is preferably deposited on a {001} plane or {110} plane of the substrate made of a single crystal of MgO or SrTiO$_3$.

In the case of the superconducting wire which is the second subject matter of the present invention, the core can be a core made of metal or ceramics or a core made of metal having a buffer layer composed of ceramics. The metals for the core are preferably platinum metals, particularly Pt, Ag, Au and their alloys but are not limited thereto. The diameter of the metal wire should be as finer as possible and is preferably less than 1 mm. The ceramics for the core are preferably oxides or compound oxides which are preferably single crystals or polycrystals but can be also glass. When the ceramic of a single crystal or polycrystal is used, the ceramics are preferably selected from those whose lattice distance is nearly same as the lattice distance of the crystal of the compound oxide to be deposited and are preferably selected from be $MgO$, $SrTiO_3$ and $ZrO_2$. The ceramics have preferably $\times 001\}$ plane or $\{110\}$ plane so that the superconducting thin film of compound oxide is grown along c-axis.

The third subject matter of the present invention is processes for producing the superconducting composite and the superconducting wire.

The processes for producing a superconducting composite or superconducting wire according to the present invention include a physical vapour deposition stage for depositing a superconducting thin film composed mainly of compound oxide on a substrate or on a core, and are characterized in that the physical vapour deposition is carried out under such an operational condition that the substantial portion of a surface of the superconducting thin film obtained finally become smooth by controlling at least one of parameters selected from a group comprising (1) a deposition rate, (2) atmosphere gas pressure, (3) oxygen gas contents and (4) high-frequency power.

The condition of (1) to (4) are described hereafter in more details.

The superconducting thin films composed of compound oxides obtained by the processes according to the present invention are thin films composed mainly of the following compound oxides (1) and (2):

  (1)

  (2)

$Ln_1Ba_2Cu_3O_{7-\delta}$  (1)

$(La_{1-x}\alpha_x)_2CuO_4$  (2)

The details of these compound oxides are already described in the first and second subject matters of the present invention and hence are not repeated here.

At first, we will describe the physical vapour deposition technique on which the processes according to the present invention based.

According to the present invention, sputtering technique, more preferably RF (radio frequency) sputtering technique which itself is well-known is used in the physical vapor deposition. In the physical vapour deposition technique, an atomic ratio of metal elements contained in a vapour source is adjusted according to difference in the evaporation rate as well as in the deposition possibility of each metal element. The vapour source is preferably constructed of a sintered mass which is prepared by powder sintering technique of material power mixture comprising metal elements and/or their oxides or carbonates and whose atomic ratio of the metal elements is adjusted according to respective vaporization rates of the metal elements, or is constructed of a sintered powder which is obtained by pulverizing the sintered mass. The vapour source may consist of a plurality of segments each selected from powders of constituent metal elements, oxide or carbonate such as powders of $Y_2O_3$, CuO and $BaCuO_2$. For example, the vapour source can consist of two segments of elemental Cu powder and a compound oxide of Ba and Y.

The substrate on which the superconducting thin film of compound oxide is deposited is preferably a single crystal whose lattice distance is nearly same as the lattice distance of the crystal of the compound oxide such as a single crystal of $MgO$, $SrTiO_3$ or $ZrO_2$. The deposition surface is preferably $\{001\}$ plane or $\{110\}$ plane of the single crystal of $MgO$ or $SrTiO_3$.

In the case of the superconducting wire, the core can be a metal wire or ceramic wire or a metal wire having a thin buffer layer composed of ceramics. The metals for the core are preferably platinum metals, particularly Pt, Ag, Au and their alloys but are not limited thereto. The diameter of the metal wire should be as finer as possible and is preferably less than 1 mm. The ceramics for the core or for the thin buffer layer are preferably oxides or compound oxides which are preferably single crystals or polycrystals but can be also glass. When the ceramic of a single crystal or polycrystal is used, the ceramics are preferably selected from those whose lattice distance is nearly same as the lattice distance of the crystal of the compound oxide and are preferably selected from $MgO$, $SrTiO_3$ and $ZrO_2$. The ceramics have preferably $\{001\}$ plane or $\{110\}$ plane so that the superconducting thin film of compound oxide is grown along c-axis.

According to a preferred embodiment, the substrate or the core is heated during the sputtering stage. The heating temperature for the substrate or the core is 200° to 950° C., preferably 500° to 920° C. If the temperature of the substrate or core is not higher than 200° C., the deposited compound oxide do not possess proper crystalline structure but become glass and hence do not show superconducting property. To the contrary, if the temperature of the substrate or core exceed 950° C., another crystalline structure which does not show superconducting property is produced in the deposited compound oxide.

Now, we will describe the above-mentioned sputtering conditions (1) to (4). These conditions (1) to (4) are determined from different points of view on the present invention and have respective ranges defined hereafter. In the present invention, each of the conditions can be selected solely or more than two conditions selected from these conditions can be combined with each other.

(1) Deposition rate

The deposition rate which is defined according to the first aspect of the present invention must be within a range of 0.05 to 1 Å/sec, preferably within a range of 0.1 to 0.8 Å/sec. Experiments which were conducted by the present inventors revealed such a fact that, if the deposition rate during the physical vapour deposition exceed 1 Å/sec, the critical current density observed in the superconducting thin film obtained deteriorate sharply, so that such superconducting thin film can not be used in practical uses. To the contrary, if the deposition rate during the physical vapour deposition is not higher than 0.005 Å/sec, the deposition speed become too much slow to perform the deposition in the industrial scale.

(2) Atmosphere gas pressure

The atmosphere gas pressure which is defined according to the second aspect of the present invention must be within a range of 0.001 to 0.5 Torr, preferably within a range of 0.01 to 0.03 Torr.

(3) Oxygen gas contents

In the present invention, a mixed gas consisting of inert gas and oxygen is selected as the atmosphere gas in the sputtering stage. The proportion of oxygen or the oxygen contents in the mixed gas which is defined according to the third aspect of the present invention must be within a range of 5 to 95%, preferably within a range of 10 to 80%. The inert gas or sputtering gas which can be mixed with oxygen is preferably argon.

(4) High-frequency power

In the present invention, the sputtering is preferably performed by RF (radio frequency) magnetron sputtering technique. The high-frequency power applied during the sputtering stage which is defined according to the forth aspect of the present invention must be within a range of 5 to 200 W with respect to a target having a diameter of 10 cm, that is 0.064 to 2.55 W/cm$^2$.

When the oxygen contents in the sputtering as is low, the high-frequency power is also reduced relatively to a range of 5 to 100 W with respect to a target having a diameter of 10 cm, that is 0.064 to 1.27 W/cm$^2$. To the contrary, if the oxygen contents in the sputtering gas is higher than 30 to 95% by molecule, particularly 40 to 80% by molecule, the high-frequency power is preferably increased to a range of 1.27 to 2.55 W/cm$^2$.

According to the processes of the present invention, the sputtering is carried out under such a condition that the the substantial portion of a surface of said superconducting thin film becomes smooth.

The smoothness of the superconducting thin film obtained is evaluated by such a fact that the surface roughness R$_{max}$ (datum length = 1,000 μm) of the superconducting thin film composed mainly of compound oxide is less than 0.2 μm. The value of the surface roughness R$_{max}$ is determined by observing the thin film obtained microscopically, particularly by SEM.

According to a preferred embodiment of the processes of the present invention, after deposition of the thin film complete, the resulting thin film is further heat-treated or annealed in an oxygen-containing atmosphere and then is cooled slowly. The heat-treatment is preferably carried out at a temperature ranging 800° to 960° C. and the cooling rate of the thin film is preferably less than 10° C./min. The heat-treatment is preferably carried out at a partial oxygen pressure ranging 0.1 to 10 atm. The purpose of the heat-treatment is to adjust the oxygen deficiency in the compound oxide. In fact, the thin film which is not subjected to the heat-treated often shows poor superconducting property and in the worst case does not exhibit superconducting property. Therefore, the heat-treatment is preferable.

The superconducting thin film of the above-mentioned type compound oxides shows anisotropy in the critical current density. Namely, the current passing along a direction which is in parallel with a plane defined by a-axis and b-axis of the crystal show a very high critical current density, while the current passing along the other directions is relatively lower. Therefore, in order to accord the crystalline orientation of the superconducting thin film with that of the substrate, it is a general practice to deposit the superconducting thin film on the specified plane of a single crystal such as MgO, SrTiO$_3$, YSZ, ZrO$_2$ or the like whose lattice distance is nearly same as the lattice distance of the compound oxide crystal. However, the maximum critical current density "Jc" of the conventional processes have been limited to a rather low value of $1 \times 10^5$ A/cm$^2$ because the orientation of crystal could not ordered satisfactorily.

The advantage of the processes according to the present invention reside in that the critical current density "Jc" of the superconducting thin film can be increased at one effort to the level of $1 \times 10^6$ A/cm$^2$ which is one order higher than the conventional value. Such great improvement in the critical current density result from such a fact that the surface roughness of the superconducting thin film of compound oxide is improved by adjusting at least one of the conditions (1) to (4) to the optimum value.

Although the theoretical reason why such important improvement in the current density "Jc" can be achieved by the improvement in the surface roughness is not clear under the present situation, we think that the improvement in the current density "Jc" may come from such a reason that the direction of crystalline orientation of c-axis in the superconducting thin film prepared by the present invention is ordered perpendicularly or nearly perpendicularly with respect to a surface of the substrate or the core. Therefore, it is preferable to deposit the superconducting thin film on {001} plane of a single crystal of MgO or SrTiO$_3$. It is also possible to use {110} plane. In this case, the c-axis become in parallel with a surface of a substrate, so that current is flown perpendicularly with respect to the c-axis in the practical uses. Still more, since the thermal expansion coefficient of MgO or SrTiO$_3$ is similar to that of the superconductor of compound oxide, the thin film is not subjected to undesirable stress caused by difference in the thermal expansion coefficient which will be exerted during the heating and cooling stages.

In conclusion, the superconducting thin film obtained by the process according to the present invention exhibit very higher critical current density than those that are prepared by the conventional processes.

Now, several embodiments of the processes for producing the superconducting composites and superconducting wires according to the present invention will be described by Examples, but the scope of the present invention should not be limited thereto.

The experiments shown in the following Examples were conducted for the purpose of determining the optimum ranges for each of the conditions (1) to (4) with respect to $Ln_1Ba_2Cu_3O_{7-\delta}$ type superconductors and $(La_{1-x}\alpha_x)_2CuO_4$ type superconductors.

In the Examples, the critical temperature of superconductivity (Tc) is determined by the conventional four probe method. The critical current density (Jc) is determined at 77.0K and is expressed by A/cm$^2$. Namely, electric resistance is measured with increasing the amount of current and a value of the current intensity where resistance detected at first is divided by a cross sectional area through which current pass.

The value of the surface roughness R$_{max}$ is determined by taking a photo of the thin film deposited by SEM (Scanning Electron Microscopy).

$Ln_1Ba_2Cu_3O_{7-\delta}$ Type Superconducting Thin Films

EXAMPLE 1

Superconducting thin films are prepared by RF magnetron sputtering technique. Targets used in the Examples are compound oxides of Ln—Ba—Cu—O ceramics each having an atomic ratio of Ln:Ba:Cu = 1:224:4.35. "Ln" stands for lanthanide elements shown in Table 1.

Each targets has a disk-shape having a diameter of 100 mm. The sputtering is carried out under same operational conditions for all samples. The operational conditions are as following:
Substrate: MgO {001} plane
Atmosphere gas: $O_2/(O_2+Ar)=20$
Atmosphere gas pressure: 0.1 Torr
Substrate temperature: 700° C.
High-frequency power: 40 W(0.51 W/cm$^2$)
Sputtering time: 6 hours
Thickness of the thin film: 0.88 μm
(Deposition rate=0.35 Å/sec)

After the deposition complete, the resulting thin film deposited on the substrate is heated at 900° C. for three hours and then cooled to ambient temperature at a cooling rate of 5° C./min.

The critical temperature and the critical current density observed on the resulting thin films are summarized in Table 1.

As comparative examples, sputtering is carried out under the same conditions as above except that the high-frequency power is increase to 150 W (1.9 W/cm$^2$). The results are also shown in Table 1.

TABLE 1

|  | Ln | Critical temperature Tc (K.) | Critical current density Jc (A/cm$^2$) |
|---|---|---|---|
| Comparative | Ho | 82.0 | 850 |
|  | Tm | 82.0 | 850 |
|  | Lu | 82.0 | 845 |
| Present invention | Ho | 82.1 | $2.0 \times 10^6$ |
|  | Er | 86.0 | $2.5 \times 10^6$ |
|  | Y | 81.0 | $1.5 \times 10^6$ |
|  | Dy | 83.2 | $2.5 \times 10^6$ |
|  | Gd | 81.0 | $1.7 \times 10^6$ |
|  | Eu | 80.6 | $1.2 \times 10^6$ |
|  | Sm | 80.4 | $1.0 \times 10^6$ |
|  | Yb | 80.2 | $1.0 \times 10^6$ |
|  | Nd | 80.8 | $1.2 \times 10^6$ |
|  | La | 79.0 | $0.8 \times 10^6$ |
|  | Tm | 82.1 | $1.8 \times 10^6$ |
|  | Lu | 80.4 | $1.0 \times 10^6$ |

It is apparent from the results shown in Table 1, the superconducting thin films prepared in the condition defined by the present invention exhibit much higher critical current density that the comparative examples.

From such a fact that we can not find any unevenness on the surfaces of the thin films of compound oxides obtained by the present invention when the surfaces are observed by SEM at 10,000 magnifications, while there exist grains of several microns on the surfaces of the thin films obtained by the comparative examples, we can estimate that the structure of the superconducting thin films of compound oxides obtained by the process according to the present invention is uniform and compacted.

EXAMPLE 2

Superconducting thin films are prepared by RF magnetron sputtering technique. Targets used in the Examples are ceramics of compound oxides of Ln—Ba—Cu—O which are prepared by usual sintering technique in which material powders whose atomic ratio of Ln:Ba:Cu is adjusted to 1:224:4.35 is sintered. "Ln" stands for lanthanide elements shown in Table 2. Each targets has a disk-shape having a diameter of 100 mm. The sputtering is carried out under the identical operational conditions for all samples. The operational conditions are as following:
Substrate: MgO {001} plane
Substrate temperature: 700° C.
Atmosphere gas: $O_2/(O_2+Ar)=20$
Atmosphere gas pressure: 0.1 Torr
High-frequency power: 40 W (0.51 W/cm$^2$)
Sputtering time: 6 hours
Thickness of the thin film: 0.88 μm
(Deposition rate=0.35 Å/sec)

After the deposition complete, the resulting thin film deposited on the substrate is heated in $O_2$ of atmospheric pressure at 900° for one hour and then cooled to ambient temperature at a cooling rate of 5° C./min. The critical temperature and the critical current density observed on the resulting thin films are summarized in Table 2.

As comparative examples, sputtering is carried out under the same conditions as above except that the deposition rate is increase to 1.5 Å/sec. The results are also shown in Table 2.

TABLE 2

|  | Ln | Critical temperature Tc (K.) | Critical current density Jc (A/cm$^2$) |
|---|---|---|---|
| Comparative | Ho | 82.0 | 850 |
|  | Tm | 82.0 | 850 |
|  | Lu | 80.0 | 840 |
| Present invention | Ho | 82.2 | $1.9 \times 10^6$ |
|  | Er | 87.1 | $2.8 \times 10^6$ |
|  | Y | 80.5 | $1.4 \times 10^6$ |
|  | Dy | 83.1 | $2.6 \times 10^6$ |
|  | Gd | 81.2 | $1.8 \times 10^6$ |
|  | Eu | 80.5 | $1.1 \times 10^6$ |
|  | Sm | 80.0 | $0.9 \times 10^6$ |
|  | Yb | 80.0 | $0.9 \times 10^6$ |
|  | Nd | 80.4 | $1.1 \times 10^6$ |
|  | La | 79.3 | $0.8 \times 10^6$ |
|  | Tm | 82.2 | $1.5 \times 10^6$ |
|  | Lu | 80.5 | $1.0 \times 10^6$ |

It is apparent from the results shown in Table 2, the superconducting thin films prepared in the condition defined by the present invention exhibit much higher critical current density than the comparative examples.

From such a fact that we can not find any unevenness on the surfaces of the thin films of compound oxides obtained by the present invention when the surfaces are observed by SEM at 10,000 magnifications, while there exist grains of several microns on the surfaces of the thin films obtained by the comparative examples, we can estimate that the structure of the superconducting thin films of compound oxides obtained by the process according to the present invention is uniform and compacted.

EXAMPLE 3

Superconducting thin films are prepared by RF magnetron sputtering technique. Targets used in the Examples are ceramics of compound oxides of Ln—Ba—Cu—O which are prepared by usual sintering technique in which material powders whose atomic ratio of Ln:Ba:Cu is adjusted to 1:2.24:4.35 is sintered. "Ln" stands for lanthanide elements shown in Table 3. Each targets has a disk-shape having a diameter of 100 mm. The sputtering is carried out under the identical operational conditions for all samples. The operational conditions are as following:
Substrate: MgO {001} plane
Substrate temperature: 700° C.
Atmosphere gas pressure: 0.1 Torr
Sputtering gas: $O_2(20\%)/Ar(80\%)$ High-frequency power: 40 W (0.51 W/cm$^2$)
Sputtering time: 6 hours
Thickness of the thin film: 0.88 μm
Deposition rate: 0.35 Å/sec
Annealing: 900° C./3 hours
(cooled at a cooling rate of 5° C./min)

The critical temperature, the critical current density and the surface roughness observed on the resulting thin films are summarized in Table 3.

As comparative examples, sputtering is carried out under the same conditions as above except that the deposition rate is increase to 1.5 Å/sec. The results are also shown in Table 3.

TABLE 3

|  | Ln | Critical temp. Tc (K.) | Critical current density Jc (A/cm$^2$) | Surface roughness $R_{max}$(μm) |
|---|---|---|---|---|
| Compara- | Ho | 82.0 | 850 | 0.07 |
| tive | Tm | 83.0 | 860 | 0.06 |
|  | Lu | 81.0 | 840 | 0.08 |
| Present | Ho | 82.4 | 2.0 × 10$^6$ | 0.001 |
| invention | Er | 87.3 | 3.0 × 10$^6$ | 0.002 |
|  | Y | 80.9 | 1.5 × 10$^6$ | 0.002 |
|  | Dy | 83.9 | 2.5 × 10$^6$ | 0.002 |
|  | Gd | 81.4 | 1.8 × 10$^6$ | 0.001 |
|  | Eu | 80.4 | 1.0 × 10$^6$ | 0.002 |
|  | Sm | 80.4 | 1.0 × 10$^6$ | 0.001 |
|  | Yb | 80.0 | 0.9 × 10$^6$ | 0.002 |
|  | Nd | 80.5 | 1.1 × 10$^6$ | 0.002 |
|  | La | 79.0 | 0.8 × 10$^6$ | 0.001 |
|  | Tm | 82.4 | 1.9 × 10$^6$ | 0.003 |
|  | Lu | 79.0 | 0.9 × 10$^6$ | 0.002 |

It is apparent from the results shown in Table 3, the superconducting thin films prepared in the condition defined by the present invention exhibit much higher critical current density than the comparative examples.

In the case of the present invention, although voids of several microns are observed in a very small portion (about 1% of the whole surface) of surfaces of the thin films prepared by the process according to the present invention, we can not find unevenness on the majority surface of the thin films when the surfaces are observed by SEM at 10,000 magnifications. To the contrary, in the case of the thin films of compound oxide obtained by the comparative examples, we find innumerable grains of several microns on the surfaces.

EXAMPLE 4

Superconducting thin films are prepared by RF magnetron sputtering technique. Targets used in the Examples are ceramics of compound oxides of Ln—Ba—Cu—O which are prepared by usual sintering technique in which material powders whose atomic ratio of Ln:Ba:Cu is adjusted to 1:2.24:4.35 is sintered. "Ln" stands for lanthanide elements shown in Table 4. Each targets has a disk-shape having a diameter of 100 mm. The sputtering is carried out under the identical operational conditions for all samples. The operational conditions are as following:
Substrate: MgO {001} plane
Substrate temperature: 700° C.
Atmosphere gas: O$_2$/(O$_2$+Ar)=50
Atmosphere gas pressure: 0.1 Torr
High-frequency power: 150 W (1.9 W/cm$^2$)
Sputtering time: 6 hours
Thickness of the thin film: 0.88 μm
(Deposition rate=0.35 Å/sec)

After the deposition complete, the resulting thin film deposited on the substrate is heated in O$_2$ of atmospheric pressure at 900° for one hour and then cooled to ambient temperature at a cooling rate of 5° C./min. The critical temperature and the critical current density observed on the resulting thin films are summarized in Table 4.

As comparative examples, sputtering is carried out under the same conditions as above except that the deposition rate is increase to 1.5 Å/sec. The results are also shown in Table 4.

TABLE 4

|  | Ln | Critical temperature Tc (K.) | Critical current density Jc (A/cm$^2$) |
|---|---|---|---|
| Comparative | Ho | 81.9 | 800 |
|  | Tm | 82.1 | 810 |
|  | Lu | 81.9 | 790 |
| Present invention | Ho | 82.6 | 2.2 × 10$^6$ |
|  | Er | 87.0 | 2.8 × 10$^6$ |
|  | Y | 81.0 | 1.5 × 10$^6$ |
|  | Dy | 82.7 | 2.4 × 10$^6$ |
|  | Gd | 81.5 | 1.8 × 10$^6$ |
|  | Eu | 80.2 | 1.0 × 10$^6$ |
|  | Sm | 80.4 | 1.0 × 10$^6$ |
|  | Yb | 80.0 | 0.9 × 10$^6$ |
|  | Nd | 80.4 | 1.0 × 10$^6$ |
|  | La | 79.5 | 0.9 × 10$^6$ |
|  | Tm | 81.0 | 1.2 × 10$^6$ |
|  | Lu | 79.5 | 1.8 × 10$^6$ |

It is apparent from the results shown in Table 4, the superconducting thin films prepared in the condition defined by the present invention exhibit much higher critical current density than the comparative examples.

From such a fact that we can not find any unevenness on the surfaces of the thin films of compound oxides obtained by the present invention when the surfaces are observed by SEM at 10,000 magnifications, while there exist grains of several microns on the surfaces of the thin films obtained by the comparative examples, we can estimate that the structure of the superconducting thin films of compound oxides obtained by the process according to the present invention is uniform and compacted.

EXAMPLE 5

Superconducting thin films are prepared by RF magnetron sputtering technique. Targets used in the Examples are ceramics of compound oxides of Ln—Ba—Cu—O which are prepared by usual sintering technique in which material powders whose atomic ratio of Ln:Ba:Cu is adjusted to 1:2.24:4.35 is sintered. "Ln" stands for lanthanide elements shown in Table 5. Each targets has a disk-shape having a diameter of 100 mm. The sputtering is carried out under the identical operational conditions for all samples. The operational conditions are as following:
Substrate: MgO {001} plane
Substrate temperature: 690° C.
High-frequency power: 100 W (1.27 W/cm$^2$)
Sputtering time: 6 hours
Thickness of the thin film: 0.88 μm
Deposition rate 0.35 Å/sec
Atmosphere gas pressure: 0.15 Torr
Atmosphere gas: O$_2$/Ar (20/80)

After the deposition complete, the resulting thin film deposited on the substrate is heated in O$_2$ of atmospheric pressure at 910° C. for three hours and then cooled to ambient temperature at a cooling rate of 5° C./min. The critical temperature and the critical current density observed on the resulting thin films are summarized in Table 5.

As comparative examples, sputtering is carried out under the same conditions as above except that the atmosphere gas pressure is changed to 0.008 Torr and 0.7 Torr and the high-frequency power is increased to 150 W (1.9 W/cm$^2$). The results are also shown in Table 5.

TABLE 5

|  | Ln | Critical temperature Tc (K.) | Critical current density Jc (A/cm$^2$) |
|---|---|---|---|
| Comparative (1) | Ho | 81.0 | 450 |
|  | Tm | 81.0 | 450 |
|  | Lu | 81.4 | 460 |
| Comparative (2) | Ho | 81.0 | 450 |
|  | Tm | 81.0 | 870 |
|  | Lu | 81.8 | 910 |
| Present invention | Ho | 82.0 | $1.9 \times 10^6$ |
|  | Er | 87.0 | $2.8 \times 10^6$ |
|  | Y | 81.0 | $1.9 \times 10^6$ |
|  | Dy | 83.0 | $2.5 \times 10^6$ |
|  | Gd | 81.0 | $1.7 \times 10^6$ |
|  | Eu | 80.2 | $1.0 \times 10^6$ |
|  | Sm | 80.5 | $1.1 \times 10^6$ |
|  | Yb | 80.0 | $0.9 \times 10^6$ |
|  | Nd | 80.5 | $1.1 \times 10^6$ |
|  | La | 79.2 | $0.8 \times 10^6$ |
|  | Tm | 81.8 | $1.7 \times 10^6$ |
|  | Lu | 79.2 | $0.9 \times 10^6$ |

Note (1) atmosphere gas pressure = 0.0008 Torr high-frequency power = 150 W (1.9 W/cm$^2$)
Note (2) atmosphere gas pressure = 0.7 Torr high-frequency power = 150 W (1.9 W/cm$^2$)

It is apparent from the results shown in Table 5, the superconducting thin films prepared in the condition defined by the present invention exhibit much higher critical current density than the comparative examples.

We can not find unevenness on about 98% of the whole surfaces of the thin films of compound oxides obtained by the present invention when the surfaces are observed by SEM at 10,000 magnification. To the contrary, there exist grains of several microns on the surfaces of the thin films obtained by the comparative examples.

EXAMPLE 6

Superconducting wires are produced by RF magnetron sputtering technique.

A core used is a rod of MgO having a length of 150 mm and a diameter of 1 mm which is manufactured by molten drawing technique. The rod is rotated about its own axis in front of a substrate holder in a chamber of a RF magnetron sputtering machine during the sputtering operation.

Targets used in the examples are ceramics of compound oxides of Ln—Ba—Cu—O which are prepared by usual sintering technique in which material powders whose atomic ratio of Ln:Ba:Cu is adjusted to 1:2.24:4.35 is sintered. "Ln" stands for lanthanide elements shown in Table 6. Each targets has a disk-shape having a diameter of 100 mm. The sputtering is carried out under the identical operational conditions for all samples. The operational conditions are as following:
Heating temperature of the core: 700° C.
Sputtering pressure: 0.1 Torr
Oxygen contents: O$_2$(20%)/Ar(80%)
High-frequency power: 40 W (0.51 W/cm$^2$)
Sputtering time: 6 hours
Deposition rate: 0.30 Å/sec Annealing: 900° C./3 hours
(cooled at a cooling rate of 5° C./min)

The critical temperature, the critical density and the surface roughness observed on the resulting thin films are summarized in Table 6.

TABLE 6

| Sample No. | Ln | Critical temp. Tc (K.) | Critical current density Jc (A/cm$^2$) | Surface roughness $R_{max}(\mu m)$ |
|---|---|---|---|---|
| 1 | Ho | 82.0 | $2.0 \times 10^6$ | 0.008 |
| 2 | Er | 88.1 | $2.0 \times 10^6$ | 0.009 |
| 3 | Y | 81.0 | $2.0 \times 10^6$ | 0.010 |
| 4 | Dy | 84.0 | $1.8 \times 10^6$ | 0.022 |
| 5 | Gd | 77.1 | $0.1 \times 10^6$ | 0.012 |
| 6 | Eu | 78.1 | $0.5 \times 10^6$ | 0.008 |
| 7 | Sm | 79.2 | $0.6 \times 10^6$ | 0.032 |
| 8 | Yb | 75.1 | $0.3 \times 10^6$ | 0.031 |
| 9 | Nd | 72.3 | $0.1 \times 10^6$ | 0.042 |
| 10 | La | 78.2 | $0.5 \times 10^6$ | 0.012 |

In the case of the present invention, although voids of several microns are observed in a very small portion (about 1% of the whole surface) on surfaces of the thin films prepared, we can not find unevenness on the majority surface of the thin films when the surfaces are observed by SEM at 10,000 magnifications. To the contrary, in the case of the thin films of compound oxide obtained by the comparative examples, we find innumerable grains of several microns on the surfaces.

$(La_{1-x}\alpha_x)_2CuO_4$ Type Superconductors

EXAMPLE 7

Superconducting thin films are prepared by RF magnetron sputtering technique.

Targets used in the Examples are sintered blocks of compound oxides whose atomic ratio of La:Ba (or Sr):Cu is adjusted to 1.8:0.2:1. Each target has a disk-shape having a diameter of 100 mm. The sputtering is carried out under the following operational conditions:
Substrate: MgO {001} plane
Atmosphere gas: O$_2$/(O$_2$+Ar)=20
Atmosphere gas pressure: 0.1 Torr
Substrate temperature: 700° C.
High-frequency power: 40 W (0.51 W/cm$^2$)
Sputtering time: 6 hours
Thickness of the thin film: 0.88 $\mu$m
(Deposition rate 0.35 Å/sec)

After the deposition complete, the resulting thin film deposited on the substrate is heated in air at 900° C. for three hours and then cooled to ambient temperature at a cooling rate of 5° C./min.

As comparative examples, sputtering is carried out under the same conditions as above except that the high-frequency power is increased to 150 W (1.9 W/cm$^2$).

The results are also shown in Table 7.

TABLE 7

|  | $\alpha$ | Critical temperature Tc (K.) | Critical current density Jc (A/cm$^2$) |
|---|---|---|---|
| Comparative | Ba | 28 | 500 |
|  | Sr | 38 | 1,000 |
| Present invention | Ba | 28 | $1 \times 10^5$ |
|  | Sr | 38 | $1 \times 10^6$ |

EXAMPLE 8

Superconducting thin films are prepared by RF magnetron sputtering technique.

Targets used in the Examples are sintered blocks of compound oxides whose atomic ratios of La:Ba (or Sr):Cu are adjusted to 1.8:0.2:1. Each target has a disk-shape having a diameter of 100 mm. The sputtering is carried out under the following operational conditions:
Substrate: MgO {001} plane
Atmosphere gas: $O_2/(O_2+Ar)=20$
Atmosphere gas pressure: 0.1 Torr
Substrate temperature: 700° C.
High-frequency power: 40 W (0.51 W/cm$^2$)
Sputtering time: 6 hours
Thickness of the thin film: 0.88 μm
(Deposition rate 0.35 Å/sec)

After the deposition complete, the resulting thin film deposited on the substrate is heated in air at 900° C. for one and then cooled to ambient temperature at a cooling rate of 5° C./min.

As comparative examples, sputtering is carried out under the same conditions as above except that the deposition rate is increased to 1.5 Å/sec.

The results are also shown in Table 8.

TABLE 8

| | α | Critical temperature Tc (K.) | Critical current density Jc (A/cm$^2$) |
|---|---|---|---|
| Comparative | Ba | 28 | 70 |
| | Sr | 38 | 150 |
| Present invention | Ba | 28 | $1 \times 10^5$ |
| | Sr | 38 | $1 \times 10^6$ |

EXAMPLE 9

Superconducting thin films are prepared by RF magnetron sputtering technique.

Targets used in the Examples are sintered blocks of compound oxides of an element α (Ba or Sr), La and Cu which are prepared by usual sintering technique in which material powders whose atomic ratio of La:α:Cu is adjusted to 1.8:0.2:1 is sintered. Each target has a disk-shape having a diameter of 100 mm. The sputtering is carried out under the identical operational conditions for all samples. The operational conditions are as following:
Substrate: MgO {001} plane
Substrate temperature: 700° C.
Atmosphere gas pressure: 0.1 Torr
Sputtering gas: $O_2(20\%)/Ar$ (80%)
High-frequency power: 40 W (0.51 W/cm$^2$)
Sputtering time: 6 hours
Thickness of the thin film: 0.88 μm
Deposition rate 0.35 Å/sec
Annealing 900° C./3 hours
(Cooled at a cooling rate of 5° C./min)

As comparative examples, sputtering is carried out under the same conditions as above except that the deposition rate is increased to 1.5 Å/sec.

The results are also shown in Table 9.

TABLE 9

| | α | Critical temp. Tc (K.) | Critical current density Jc (A/cm$^2$) | Surface roughness $R_{max}(\mu m)$ |
|---|---|---|---|---|
| Comparative | Ba | 28 | 500 | 0.5 |
| | Sr | 38 | 1,000 | 0.3 |
| Present invention | Ba | 28 | $2.0 \times 10^6$ | 0.05 |
| | Sr | 38 | $3.0 \times 10^6$ | 0.03 |

It is apparent from the results shown in Table 9, the superconducting thin films prepared in the condition defined by the present invention exhibit much higher critical current density than the comparative examples.

Although voids of several microns are observed at a very small portion (about 1% of the whole surface) of surfaces of the thin films prepared by the present invention, we can not find unevenness on the majority surface of the thin films when the surfaces are observed by SEM at 10,000 magnifications. To the contrary, in the case of the thin films of compound oxide obtained by the comparative examples, we find innumerable grains of several microns on the surfaces.

EXAMPLE 10

Superconducting thin films are prepared by RF magnetron sputtering technique. Targets used in the Examples are sintered blocks of compound oxides whose atomic ratios of La:Ba (or Sr):Cu are adjusted to 1.8:0.2:1. Each target has a disk-shape having a diameter of 100 mm. The sputtering is carried out under the following operational conditions:
Substrate: MgO {001{ plane
Atmosphere gas: $O_2/(O_2+Ar)=50$
Substrate temperature: 700° C.
Atmosphere gas pressure: 0.1 Torr
High-frequency power: 150 W (1.9 W/cm$^2$)
Sputtering time: 6 hours
Thickness of the thin film: 0.88 μm
(Deposition rate 0.35 Å/sec)

After the deposition complete, the resulting thin film deposited on the substrate is heated in air at 900° C. for one hour and then cooled to ambient temperature at a cooling rate of 5° C./min.

As comparative examples, sputtering is carried out under the same conditions as above except that the deposition rate is increased to 1.5 Å/sec.

The results are also shown in Table 10.

TABLE 10

| | α | Critical temperature Tc (K.) | Critical current density Jc (A/cm$^2$) |
|---|---|---|---|
| Comparative | Ba | 28 | 500 |
| | Sr | 38 | 1,000 |
| Present invention | Ba | 28 | $1 \times 10^5$ |
| | Sr | 38 | $1 \times 10^6$ |

From such a fact that we can not find any unevenness on the surfaces of the thin films of compound oxides obtained by the present invention when the surfaces are observed by SEM at 10,000 magnifications, while there exist grains of several microns on the surfaces of the thin films obtained by the comparative examples, we can estimate that the structure of the superconducting thin films of compound oxides obtained by the process according to the present invention is uniform and compacted.

EXAMPLE 11

Superconducting thin films are prepared by RF magnetron sputtering technique.

Targets used in the Examples are sintered blocks of compound oxides of an element α (Ba or Sr), La and Cu which are prepared by usual sintering technique in which material powders whose atomic ratio of La:α:Cu is adjusted to 1.8:0.2:1 is sintered. Each target has a disk-shape having a diameter of 100 mm. The sputtering is carried out under the identical operational conditions for all samples. The operational conditions are as following:

Substrate: MgO {001} plane
Substrate temperature: 690° C.
High-frequency power: 100 W (1.27 W/cm$^2$)
Sputtering time: 6 hours
Thickness of the thin film: 0.88 μm
Deposition rate 0.35 Å/sec
Atmosphere gas pressure: 0.15 Torr
Atmosphere gas: O$_2$/Ar (20:80)

After the deposition complete, the resulting thin film deposited on the substrate is heated in air at 910° C. for three hours and then cooled to ambient temperature at a cooling rate of 5° C./min. The results are also shown in Table 11.

As comparative examples, sputtering is carried out under the same conditions as above except that the atmosphere gas pressure is changed to 0.008 Torr and 0.7 Torr. The results are also shown in Table 11.

TABLE 11

| | α | Critical temperature Tc (K.) | Critical current density Jc (A/cm$^2$) |
|---|---|---|---|
| Comparative (1) | Ba | 5 | 50 |
| | Sr | 10 | 200 |
| Comparative (2) | Ba | 6 | 70 |
| | Sr | 8 | 180 |
| Present invention | Ba | 28 | 1 × 10$^5$ |
| | Sr | 38 | 1 × 10$^6$ |

Note:
(1) atmosphere gas pressure = 0.0008 Torr
(2) atmosphere gas pressure = 0.7 Torr We can not find unevenness on about 98% of the whole surfaces of the thin films of compound oxides obtained by the present invention when the surfaces are observed by SEM at 10,000 magnifications. To the contrary, there exist grains of several microns on the surfaces of the thin films obtained by the comparative examples.

Ln$_1$Ba$_2$Cu$_3$O$_{7-\delta}$ Type Superconducting Thin Films

EXAMPLE 12

Superconducting thin films are prepared by RF sputtering technique. Targets used in the Examples are compound oxides of Ln—Ba—Cu—O ceramics each having an atomic ratio of Ln:Ba:Cu=1:2.24:4.35. "Ln" stands for lanthanide elements shown in Table 12. Each target has a disk-shape having a diameter of 100 mm. The sputtering is carried out under an identical operational condition for all samples. The operational conditions are as following:
Substrate: MgO {001} plane
Substrate temperature: 700° C.
Atmosphere gas pressure: 0.01 to 0.1 Torr
High-frequency power: 40 W (0.51 W/cm$^2$)
Sputtering time: 6 hours
Thickness of the thin film: 0.8 μm After the deposition complete, the resulting thin film deposited on the substrate is heated at 900° C. for one hour and then cooled to ambient temperature at a cooling rate of 5° C/min.

As comparative examples, a superconducting thin film of compound oxide containing Ho is prepared under the same conditions as above except that the high-frequency power is increase to 150 W (1.9 W/cm$^2$). The results are also shown in Table 12.

TABLE 12

| | Ln | Critical temperature Tc (K.) | Critical current density Jc (A/cm$^2$) |
|---|---|---|---|
| Comparative | Ho | 82.0 | 850 |
| Present invention | Ho | 82.1 | 2.1 × 10$^6$ |
| | Er | 88.2 | 2.0 × 10$^6$ |
| | Y | 81.6 | 2.2 × 10$^6$ |
| | Dy | 84.5 | 1.9 × 10$^6$ |
| | Gd | 77.8 | 0.1 × 10$^6$ |
| | Eu | 78.4 | 0.7 × 10$^6$ |
| | Sm | 80.1 | 0.9 × 10$^6$ |
| | Yb | 77.2 | 0.6 × 10$^6$ |
| | Nd | 77.5 | 0.3 × 10$^6$ |
| | La | 78.3 | 0.4 × 10$^6$ |

It is apparent from the results shown in Table 1, the superconducting thin films prepared in the condition defined by the present invention exhibit much higher critical current density than the comparative examples.

From such a fact that we can not find any unevenness on the surfaces of the thin films of compound oxides obtained by the present invention when the surfaces are observed by SEM at 10,000 magnifications, while there exist grains of several microns on the surfaces of the thin films obtained by the comparative examples, we can estimate that the structure of the superconducting thin films of compound oxides obtained by the process according to the present invention is uniform and compacted.

We claim:

1. A superconducting composite consisting of a substrate and a superconducting thin film which is deposited on said substrate and which consists essentially of a compound oxide whose critical temperature is greater than about 28° K., wherein a substantial portion of a surface of said superconducting thin film has a surface roughness R$_{max}$ (datum length=1,000 μm) of less than 0.2 μm and wherein said superconducting thin film has a critical current density greater than 1×10$^5$ A/cm$^2$.

2. A superconducting composite set forth in claim 1, characterized in that said superconducting thin film is composed of a compound oxide represented by the general formula:

Ln$_1$Ba$_2$Cu$_3$O$_{7-\delta}$ in which Ln stands for at least one lanthanide element selected from a group comprising La, Nd, Sm, Eu, Gd, Dy, Ho, Y, Er, Yb, Tm and Lu and δ is a number which satisfies a range of 0≦δ<1.

3. A superconducting composite set forth in claim 2, characterized in that the Ln is Y, Er, Ho or Dy.

4. A superconducting composite set forth in claim 1, characterized in that said superconducting thin film is composed of a compound oxide represented by the general formula:

(La$_{1-x}$α$_x$)$_2$CuO$_4$ in which α stands for Ba or Sr.

5. A superconducting composite set forth in claim 1, characterized in that said substrate is made of a single crystal of oxide whose lattice distance is approximately equal to the lattice distance of the crystal of said compound oxide.

6. A superconducting composite set forth in claim 5, characterized in that said substrate is made of a single crystal of MgO, SrTiO$_3$ or ZrO$_2$.

7. A superconducting composite set forth in claim 6, characterized in that said superconducting thin film is deposited on a {001} plane or {110} plane of a substrate made of a single crystal of MgO or SrTiO$_3$.

* * * * *